United States Patent [19]
Murphy

[11] Patent Number: 5,038,101
[45] Date of Patent: Aug. 6, 1991

[54] CARRIERS FOR ELECTRICAL COMPONENTS IN TRANSISTOR OUTLINE PACKAGES

[75] Inventor: Robert H. Murphy, Merrimack, N.H.

[73] Assignee: R.H. Murphy Co., Inc., Amherst, N.H.

[21] Appl. No.: 493,927

[22] Filed: Mar. 15, 1990

[51] Int. Cl.$^5$ ............................................ G01R 31/00
[52] U.S. Cl. .................. 324/158 F; 324/73.1
[58] Field of Search .............. 324/158 F, 158 P, 73.1; 361/212, 220; 206/332, 338; 439/68, 70, 526, 525, 751

[56] References Cited

U.S. PATENT DOCUMENTS

| | | | |
|---|---|---|---|
| 3,601,699 | 4/1971 | Norton, Jr. | 439/526 |
| 3,638,071 | 1/1972 | Altoner, Jr. et al. | 361/212 |
| 3,653,498 | 4/1972 | Kisor | 361/212 |
| 4,781,953 | 11/1988 | Ball | 206/332 |

FOREIGN PATENT DOCUMENTS 0236977  10/1988  Japan ............................... 324/158 F

OTHER PUBLICATIONS

Caulfield; "Component Carrier for use in Test Equipment"; IBM Technical Disclosure Bulletin; vol. 18, No. 1, Jun. 1975.

Bruder et al.; "Component Socket for Temporary Connection to a Tester Processing Station"; IBM Technical Disclosure Bulletin; vol. 9, No. 3, Aug. 1966.

Primary Examiner—Kenneth A. Wieder
Assistant Examiner—Vinh P. Nguyen
Attorney, Agent, or Firm—Pearson & Pearson

[57] ABSTRACT

Carriers for electronic components in transistor outline packages with terminals arranged in circular or rectangular arrays. The carrier has a conductive frame including a planar portion, side rails and a housing section disposed along an axis transverse to the planar section. The housing contains an insert of insulating material with apertures disposed in an array corresponding to the terminal array thereby to grip at least some of the terminals and electrically isolate those terminals from each other. The insert has a length along the transverse axis that is at least coextensive with the terminals thus to isolate the terminals completely. A portion of the insert extends along the planar surface and the insert is open to receive the terminal test leads or other mechanisms for testing the component. Specific embodiments for TO packages with a different terminal arrays are disclosed.

9 Claims, 4 Drawing Sheets

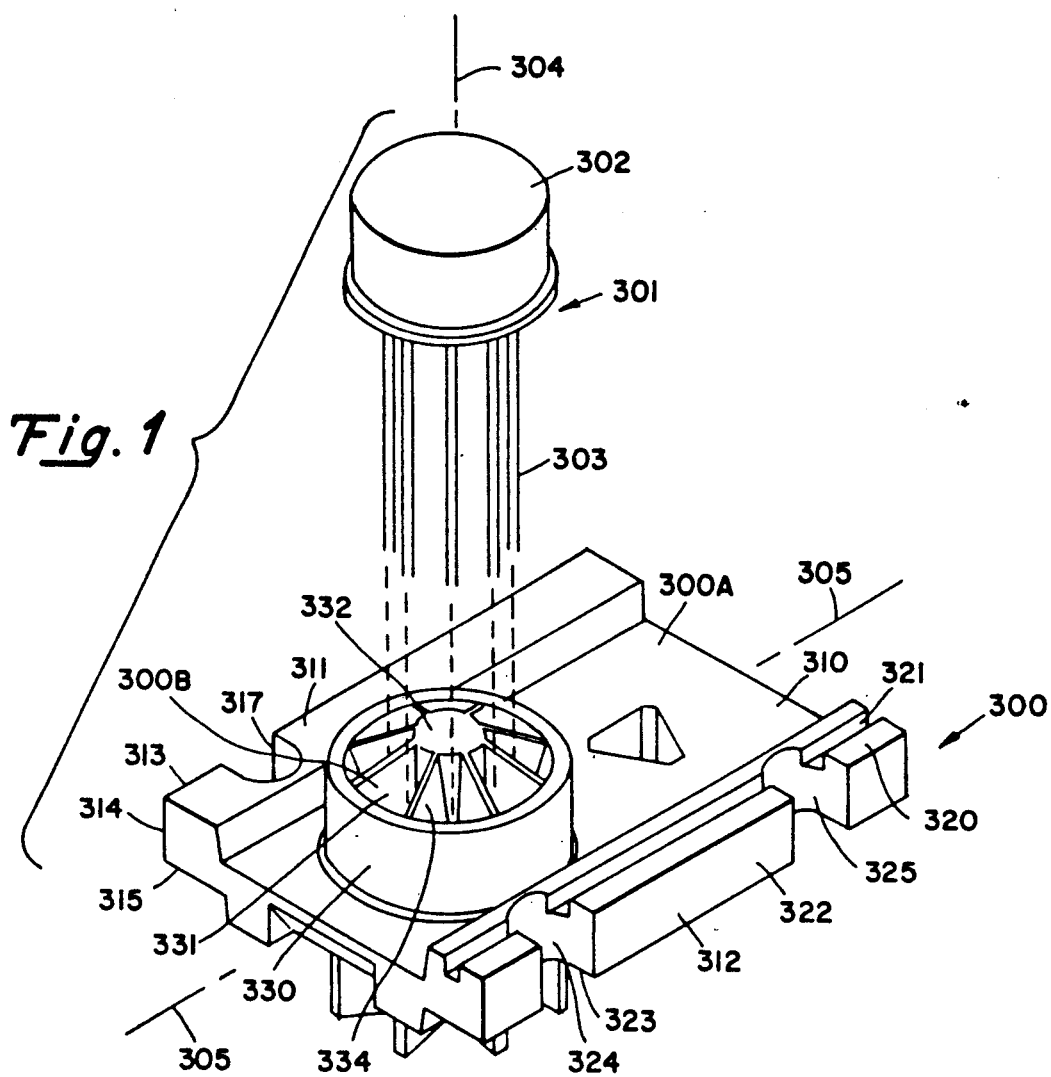
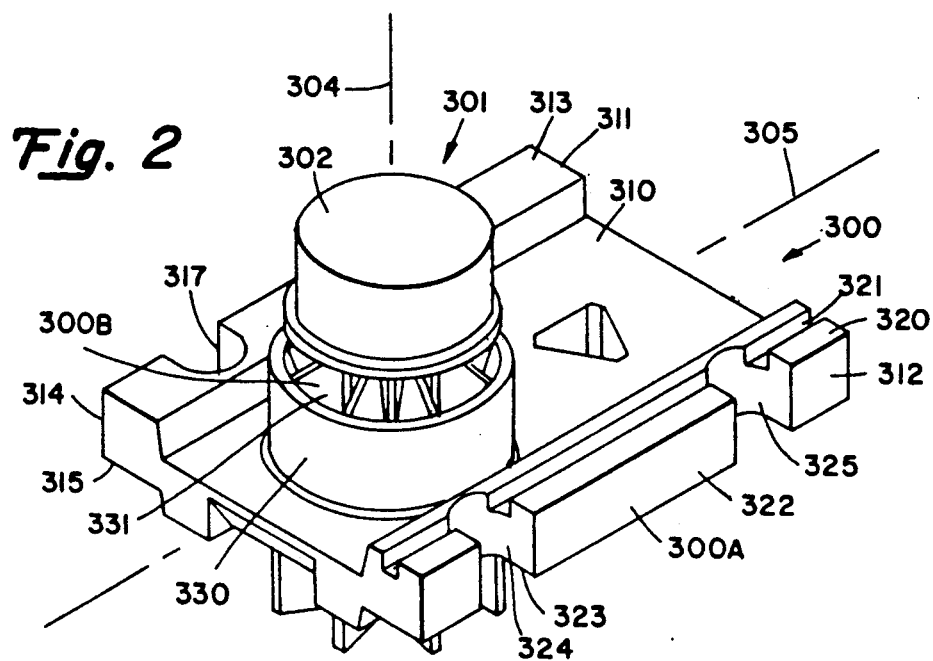

CARRIERS FOR ELECTRICAL COMPONENTS IN TRANSISTOR OUTLINE PACKAGES

BACKGROUND OF THE INVENTION

1. Field of the Invention

This invention generally relates to carriers for electronic components and more specifically to carriers for facilitating the handling of electronic components in transistor outline packages.

2. Description of Related Art

Semiconductor devices have matured from simple circuit elements into complex components provided in a variety of integrated circuit packages, such as transistor outline (TO), flatpack and pin grid array (PGA) packages. This maturation has been accompanied by an increase in the complexity of handling these components during assembly and testing operations. For example, components in TO packages have a large number of terminals and can be quite expensive. Typically a number of TO and other components occupy different positions on a single circuit board.

Components in TO and other packages are more susceptible to damage from a number of external influences, such as mechanical shock and discharges of accumulated electrostatic charge, than were prior components. The consequence of potential damage and other factors has led to changes in transportation, assembly and testing procedures that utilize such components. Indeed, procedures for handling the components now contribute significantly to the success of electronic assembly production. For example, when electronic components comprised simple transistors, resistors and capacitors, all the components would be assembled on a board without prior testing. If a component failed, debugging procedures were used to isolate defective components; then they were replaced.

It no longer is economically feasible to replace TO and other integrated circuits and similar components it they are mounted on a board. It is easier to discard the entire board with a number of valuable working components than it is to replace a single failed integrated circuit. Thus, present procedures involve component testing prior to assembly to minimize the risk of mounting a defective component. Although this adds costs to the assembly process, overall the added costs are less than those encountered when a board is assembled with a defective component and discarded.

The need to protect and test integrated circuits during assembly operations led to the development of chip carriers. Chip carriers are special enclosures or packages that house and protect an integrated circuit or the like during processing, production, testing and assembly operations. More specifically, a chip carrier orients an integrated circuit during the production process, assures proper placement and alignment of terminals for testing and for insertion into a printed circuit board. It eliminates stresses from the terminals and seals found in such an integrated circuit. Chip carriers now must protect a component from mechanical and electrical damage, provide access to all the terminals to facilitate component testing and minimize damage due to discharges of accumulated electrostatic charges if the chip carrier is to be acceptable.

As the number of integrated circuit designs and packages have proliferated, so have the number of chip carrier configurations Indeed there are different chip carrier structures for different integrated circuit packages, including chip carriers exclusively for components in TO packages. These carriers have a profile that is similar to the profile shown in FIG. 1 of the attached drawings. In such a carrier, a central planar portion extends along a travel axis. The travel axis typically lies along a direction of travel. Integral elevated side rails parallel to the axis provide a means for engagement by tracks, conveyors or tooling in a conventional electronic assembly lines thereby to manipulate the carrier. The carrier contains notches and grooves to further facilitate transportation and manipulation. These carriers are molded with a TO package support structure extending along an axis transverse to the plane of the carrier and the travel axis. This support structure generally comprises of fins that radiate from a core member to define segments that guide terminals through apertures in a supporting web. The diameters of the apertures correspond to the diameters of terminals from the TO package. The radial fins extend below the planar base for separating the terminals physically and are coextensive with the length of the terminals.

These prior carriers have been constructed during a single injection molding process using either an insulating material or an insulating material filled with a conductive material. In the former case the carrier isolates the electrical leads for component electrical testing prior to assembly. However, electrostatic charges can accumulate on such carriers and eventually may discharge and damage the components in the TO package. When the TO carrier is constructed with a material containing a conductive filler, the percentage of the filler determines the electrical conductivity characteristics of the carrier. If sufficient filler is utilized, the carrier is conductive and minimizes any accumulation of electrostatic charge. However, it is difficult to test the component because the terminals no longer are isolated electrically. Moreover, filled plastic tends to be rigid, and not so resilient as unfilled plastic. Any sliding motion between the terminals and the apertures in the supporting structure can damage the terminals particularly by eroding any plating materials on the terminals.

Theoretically a certain precise filler percentage might establish a conductivity level that was sufficient to avoid electrostatic charge accumulation, but still provide an impedance between the various terminals that was much greater than the input impedances between those terminals. In practice it is difficult, if not impossible, to control the fill fractions in injection molding materials with such precision. Thus, this approach has not gained commercial acceptance.

SUMMARY

Therefore it is an object of this invention to provide an improved carrier for TO components adapted for automated circuit production.

Another object of this invention is to provide a basic carrier structure that is adapted for TO components with different arrays of terminals.

Yet another object of this invention is to provide an improved carrier for TO components that is useful during electronic testing, that facilitates the testing of individual components and that reduces the accumulation of electrostatic charges on the component.

In accordance with this invention, a carrier for electronic components housed in Transistor Outline packages includes a conductive planar base member and a resilient insulating insert for supporting the electronic component. The conductive planar base member has a transverse holding means at a predetermined location thereon centered on a transverse axis through the planar base member. The planar base member positions the insulating insert along this axis. The insert has a plurality of apertures therethrough in register with an array of terminals from the transistor outline package. The insert insulates and isolates the terminals of the electronic component, and the use of conductive base member minimizes the accumulation of electrostatic charge.

BRIEF DESCRIPTION OF THE DRAWINGS

This invention is pointed out with particularity in the appended claims. The various objects, advantages and novel features of this invention will be more fully apparent from a reading of the following detailed description in conjunction with the accompanying drawings in which like reference numerals refer to like parts, and in which:

FIG. 1 is an exploded perspective view of an integrated circuit in an eight-terminal TO package and a chip carrier constructed in accordance with this invention;

FIG. 2 is a perspective view of the components shown in FIG. 1 in an assembled view;

DESCRIPTION OF ILLUSTRATIVE EMBODIMENTS

Figure 3:
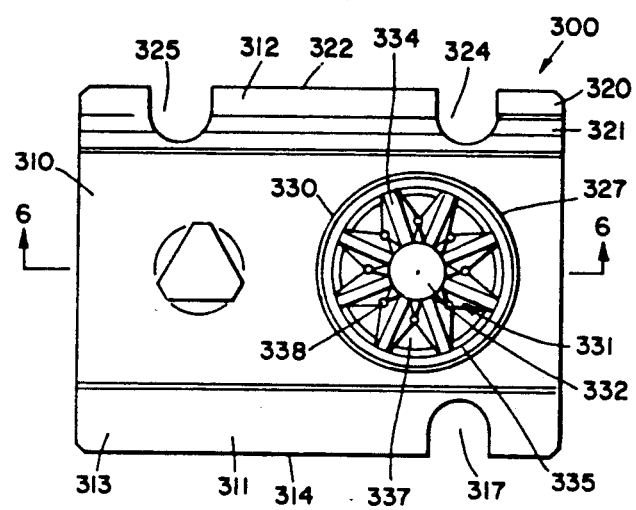
FIG. 3 is a top view the chip carrier shown in FIGS. 1 and 2.

Referring to FIGS. 1 and 2, this specific embodiment of the invention is particularly useful in connection with the transportation, handling and testing of integrated circuits in eight-terminal "transistor outline" or "TO" packages. A carrier 300 constructed in accordance with this invention carriers an eight-lead component 301 in a TO package characterized by a cylindrical housing 302 and a plurality of parallel terminals 303. The terminals 303 extend from the housing 302 in a circular or other predetermined pattern coaxially with a vertical axis 304 normal to a centrally disposed axis 305. The axis 304 represents a line along which the component 301 travels as it is being inserted in the carrier 300. The axis 305 extends longitudinally of the carrier 300; typically the carrier 300 travels along the axis 305.

The carrier 300 comprises a conductive frame member 300A and an insulating insert section 300B for supporting the component 301. The conductive frame member 300A has a central planar section 310 with a longitudinal dimension along the axis 305. The carrier 300 also includes side rails 311 and 312 disposed along the opposite edges of the planar section 310 parallel to the axis 305. The side rail 311 includes an upper surface 313 that parallels the upper surface 310. In the orientation shown in FIGS. 1 and 2, the surface 310 lies above the upper surface of the planar section 310. The side rail 311 additionally includes an outer side wall 314 and a bottom wall 315 that is raised above a bottom surface 316 of the planar section 310, as particularly shown in FIGS. 4 through 6. A U-shaped notch 317 in the side rail 311 enables external tooling to engage the side rail 311.

Similarly, the side rail 312 has an upper surface 320 that is co-planar with the surface 313 and that has a longitudinal groove 321. The side rail 312 additionally includes a side wall 322 parallel to the side wall 314, a bottom wall 323 that is co-planar with the bottom wall 315 and two U-shaped notches 324 and 325 spaced along the length of the side rail 312. The groove 321 and notches 324 and 325 facilitate transportation and manipulation during the assembly process.

Figure 4:
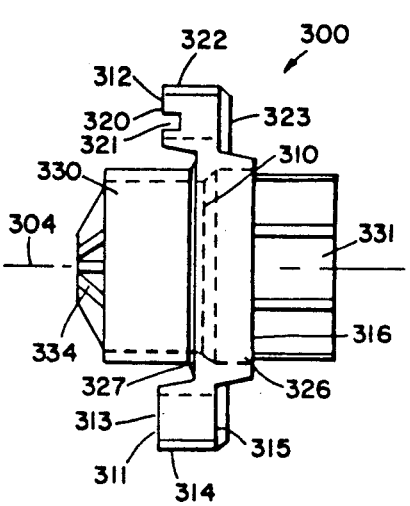
FIG. 4 is a side view the chip carrier shown in FIGS. 1 and 2.

Referring to FIG. 4, the central planar portion 310 additionally includes a lower cavity 326 and an upper cavity 327 centered on the axis 304. A cylindrical housing 330 extending from the upper surface of the planar portion 310 and centered on the axis 304 further defines the upper cavity 327. This housing portion 330 and the cavities 326 and 327 constitute a support means for an insert 331 located at a predetermined location on the conductive frame centered on the transverse axis 304.

As shown in FIGS. 1 through 6, the carrier 300 includes a planar base member 310 and a housing 330 that centers the insert 331 on the axis 304. Manufacture of the carrier 300 includes an initial molding operation that produces the central planar portion 310, side rails 311 and 312 and the housing portion 330. The carrier material should be easily molded, conductive and thermally and dimensionally stable through a range a temperatures associated with the handling and transport of components. A normal temperature range is −55° C. through +150° C. Dimensional stability is important for maintaining the overall profile of the carrier in use. Although a wide range of high-temperature molding materials are suitable for injection molding this portion of the carrier 300, carbon- and aluminum-filled polyether sulfones are preferred. Polyether imides, polyaeryl sulfones and polyesters filled with these or other conductive materials constitute other possible materials. Thus the planar section 310, side rails 311 and 312 and housing 330 constitute a rigid, conductive frame.

Figure 5:
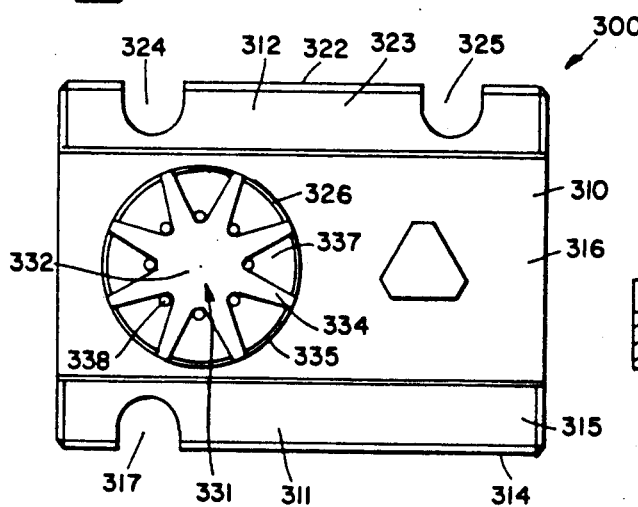
FIG. 5 is a bottom view the chip carrier shown in FIGS. 1 and 2.
Figure 6:
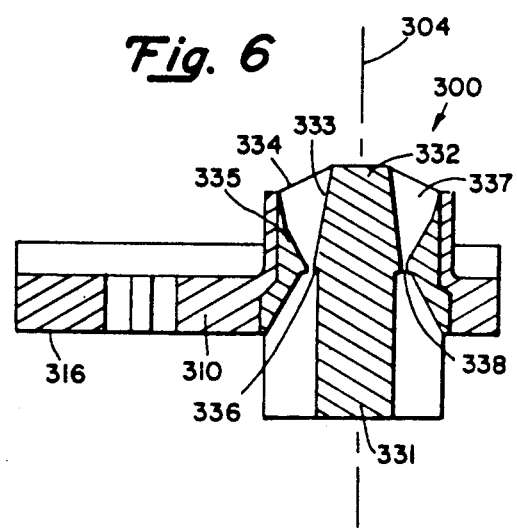
FIG. 6 is a sectional view the chip carrier shown in FIGS. 1 and 2 taken along lines 6—6 in FIG. 3.

Now referring to FIGS. 1 through 6, but with particular emphasis on FIGS. 4 through 6, the insert 331, captured in the housing 330 and cavities 326 and 327, comprises a central cylindrical core 332 disposed along the axis 304. An upper surface 333 tapers outwardly toward the median portion of the core 332 along the axis 304. A plurality of equiangularly spaced fins 334 radiate from the central core 332 to an outer surface or shell 335 adjacent the housing 330 and concentric with the central core 332. In this particular embodiment, the insert 331 has eight radial fins 334 extending from the core 332 corresponding to the eight terminals 303 from the TO package 301. A thin horizontal annular web 336 extends from the core 332 at the area of maximum flare diameter of the surface 333 to the fins 334 and shell 335. The fins 334 therefore define pie-shaped open segments 337 that have openings that are wider at the top than at the web 336. Each of the segments 337, however, is characterized by having an aperture 338 formed through the web 336 such that the array of apertures 338 corresponds to and is in register with an array of terminals 303 from a corresponding TO package 301.

Certain of the apertures 338 will have a cylindrical shape dimensioned to provide a slip fit between a terminal 303 and the material in the web 336. Others apertures will have a conical or tapered cross-section with a minimum diameter selected to produce an interference fit between the terminal 303 and the web 336.

After the central planar member 310 with its side rails 311 and 312 and housing 331 are molded, a second molding operation with any of the previously described materials but absent any filler produces the insert 331. That is, the insert 331 can be molded from a polyether sulfone, as a preferred material, or from polyimides, polyaeryl sulfones and polyesters without any conductive filler. The resulting insert 331 therefore has more resiliency than the planar section 310. Thus as terminals extend through the apertures 338, those extending through apertures with conical sections are securely held in the insert 331.

Thus as a component 301 moves along the axis 304 shown in FIG. 1 toward the finished carrier 300, the terminals 303 first position themselves in the open segments 336. The radial fins 334, the surface 333 and surface of the shell 335 all coact to guide the ends of the terminals 303 toward the apertures 338. When the terminals 303 pass through the apertures 338, the component 301 can be positioned until the housing 302 rests atop the central core 332 as shown in FIG. 2.

The fins 334 of the insert 331 also extend below the planar section 310 without the shell 335. The overall length of the insert 331 along the axis 304 is at least coextensive with the length of the terminals 303. The fins 334 isolate individual terminals 303 and facilitate the placement of test leads to individual terminals for testing purposes.

Thus, in accordance with certain of the objectives of this invention, the carrier 300 shown in FIGS. 1 through 6 securely holds an electronic component in an eight-lead TO package. The resiliency of the insert 331 minimizes any potential for damage to the terminals 303 by eroding any plating or otherwise scoring the terminals 303. The insert 331 has open segment means in the form of fins 334 that isolate individual terminals 303 to permit testing during the production process and that isolate the terminals 303 from the conductive frame. Further, the carrier 300 minimizes the accumulation of any electrostatic charge because the planar section 310, rails 311 and 312 and housing 331 are conductive.

FIGS. 7 through 12 disclose another embodiment of this invention in which a carrier 400 supports a twelve-lead component 401 in a TO package characterized by a rectangular housing 402 and twelve terminals 403. The terminals 403 are arrayed along the periphery of a square with three terminals 403 being positioned on each side of the square. The terminals also are parallel to a vertical axis 404 normal to a centrally disposed axis 405. The axis 404 represents a line along which the component 401 travels as it is being inserted in the carrier 400. The axis 405 extends longitudinally of the carrier; typically the carrier 400 travels along the axis 405.

Like the carrier 300 shown in FIGS. 1 through 6, the carrier 400 comprises a conductive frame member 400A and an insulating insert section 400B. The conductive frame member 400A has a central planar section 410 with a longitudinal dimension along the axis 405. The carrier 400 also includes side rails 411 and 412 having the same general construction and configuration as the side rails 311 and 312 described with respect to FIGS. 1 through 6. Thus, a repeated discussion of the specific configuration of the side rails, notches and grooves is not required.

Figure 7:
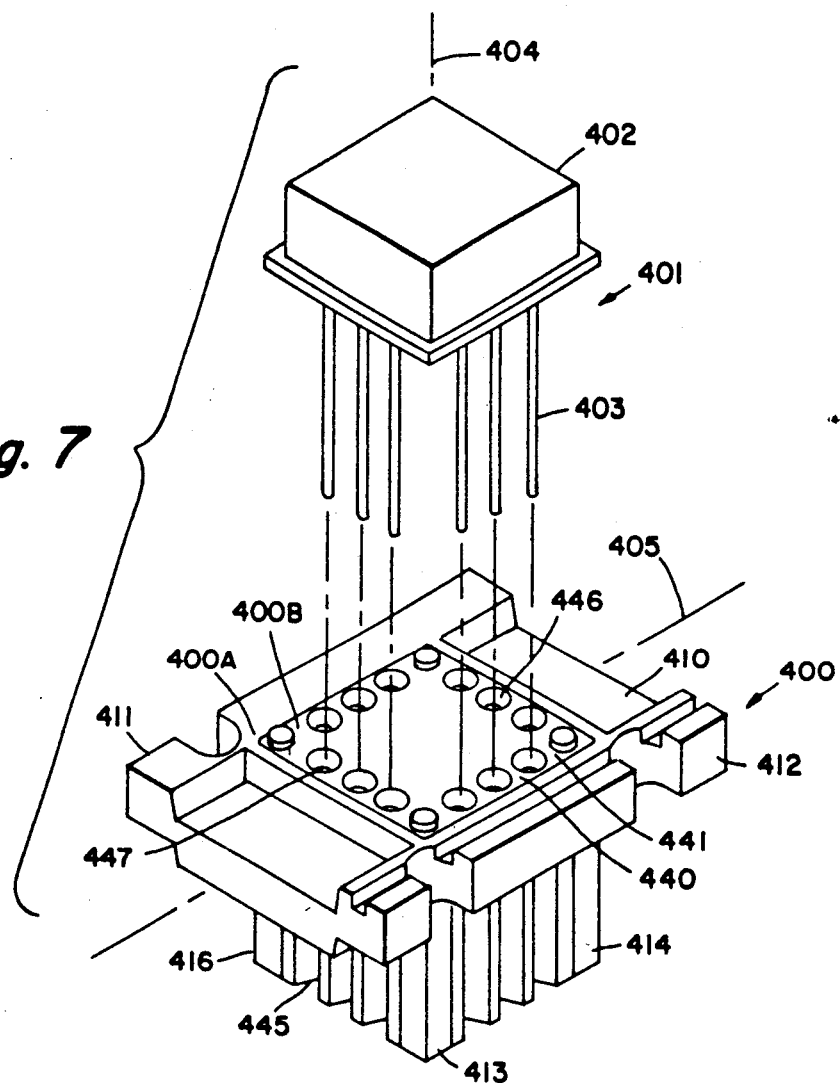
FIG. 7 is an exploded perspective view of an integrated circuit in a twelve-terminal TO pack-age and a chip carrier constructed in accordance with this invention.
Figure 8:
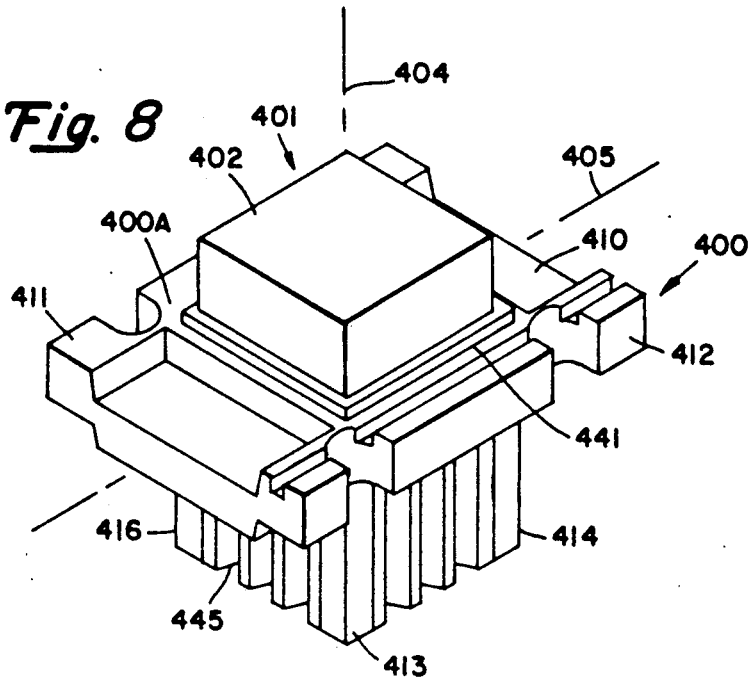
FIG. 8 is a perspective view of the components shown in FIG. 7 in an assembled view.
Figure 9:
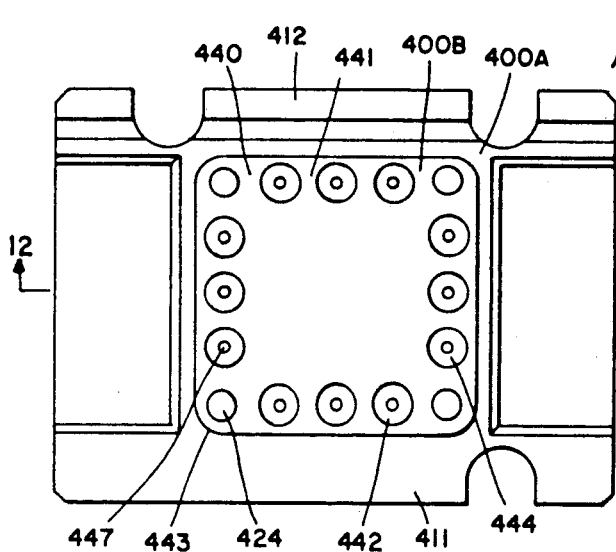
FIG. 9 is a top view the chip carrier shown in FIGS. 7 and 8.
Figure 10:
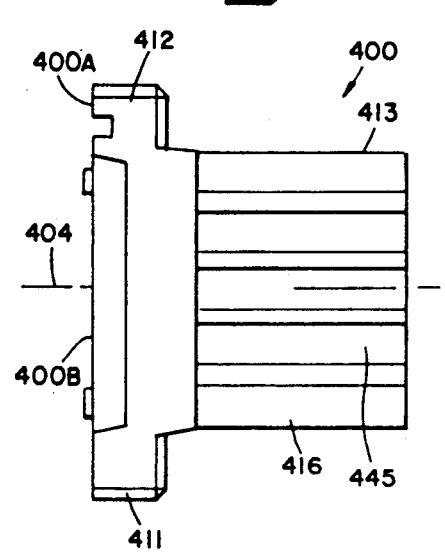
FIG. 10 is a side view the chip carrier shown in FIGS. 7 and 8.
Figure 11:
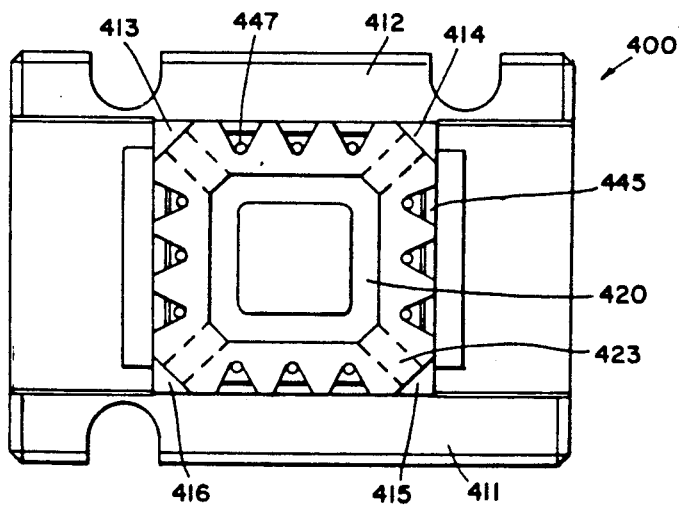
FIG. 11 is a bottom view the chip carrier shown in FIGS. 7 and 8.
Figure 12:
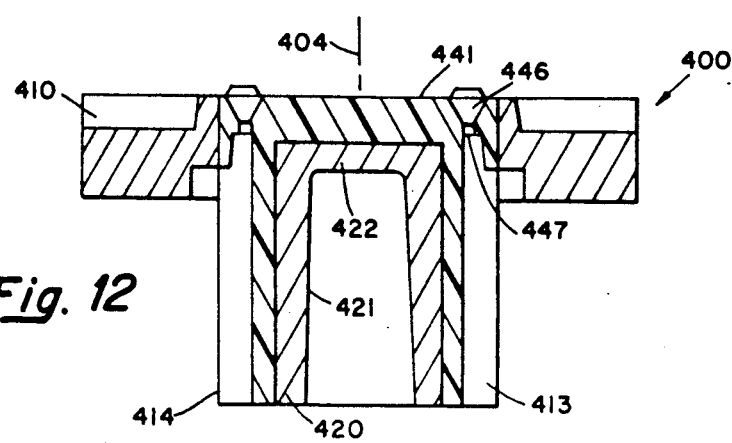
FIG. 12 is a sectional view the chip carrier shown in FIGS. 7 and 8 taken along lines 12—12 in FIG. 9.

Referring specifically to FIGS. 7, 8, and 11, four legs, designated by reference numerals 413, 414, 415, and 416, each have a triangular cross-section and depend from the bottom surface of the planar section 410. The hypotenuse of each triangular cross-section faces the central axis 404. The four legs 413 through 416 provide rigid conductive corner structures and also support a square, hollow housing 420 shown specifically in FIGS. 11 and 12. As shown most clearly in FIG. 12, the housing 420 has side walls, such as side wall 421, parallel to the axis 404. The housing 420 is open at the bottom; a top portion 422 closes the housing 420. As shown more clearly in FIG. 11, fins 423 radiate from the outer surface of the side walls, such as side wall 421, at each of the corners of the housing 420 to interconnect with the legs 413 through 416 and the housing 420 thereby to suspend the housing 420 along the axis 404.

As discussed with respect to the carrier 300 in FIGS. 1 through 6, a wide range of materials are suitable for injection molding this portion of the carrier 400. In fact the same materials can be used and, in this embodiment, carbon- or aluminum-filled polyether sulfones are preferred. Thus the planar section 410 with its side rails 411 and 412, the legs 413 through 416, square hollow housing 420 and supporting fins 423 all are formed as a rigid, conductive frame structure.

The conductive frame structure also has an upper cavity 424 nested in the top surface of the planar section 410 that contains a portion of the insulating insert 440, namely a top planar portion 441. The top planar portion 441 has a plurality of apertures 442 formed about a peripheral portion 443. A depending portion 444 of the insert 440 includes open segments formed by a plurality of vee-shaped grooves 445 in the insert 440 that extend below the apertures 442 such that each aperture 442 aligns essentially with the apex of one groove 445. The array of the apertures 442 and grooves 445 therefor corresponds to the array defined by the terminals 403 in the TO package 401. As specifically shown in FIG. 9, each edge of the top portion 441 has three apertures 442 along each edge.

The grooves 445 face outwardly perpendicular to the walls 421 of the housing 420 to terminate in planes coextensive with the outer edges of the various legs 413 through 416. Below the planar section 410 the grooves 445 are open to facilitate the placement of test leads or other apparatus. As shown particularly in FIG. 12, each aperture 442 has an upper conical section 446 that tapers to a through-hole for 447. The through-hole 447 may be a clearance hole with a diameter that produces a slip fit with the terminals 403 or a tapered or otherwise sized to produce an interference fit.

The insert 440 can be molded into and about the portions of the planar section 410 and legs 413 through 416 and housing 420 using any of the foregoing materials without any conductive fillers. As was true with the carrier described with respect to FIGS. 1 through 6, the resulting insert 440 has more resiliency than the planar section 410. Thus, as terminals 403 extend through the apertures 442, those extending through apertures that produce an interference fit are securely held by the insert 440. However, the resiliency minimizes the potential for any damage to the terminals either by eroding any plating or otherwise scoring the terminals 403.

As a component 401 moves along the axis 405 shown in FIG. 7 toward the finished carrier 400, the ends of the terminals 403 will first engage themselves in the upper conical sections 446 in the insulating insert 440. The conical portions coact to position all the terminals 403 above the through holes 447. Then the component 401 can be positioned with its housing 402 resting on the top surface of the planar section 441, as shown in FIG. 8.

Thus, in accordance with certain of the objectives of this invention, the carrier 400 shown in FIGS. 7 through 12 securely holds an electronic component in a twelve-lead TO package. The resiliency of the insert 440 minimizes any potential for damage to the terminals 403. Moreover, the insert 440 has open segment means formed by the insert 440 at the grooves 445 that isolate individual terminals 403 to facilitate testing during the production process and that isolate the terminals from the conductive frame. Further the carrier 400 minimizes the accumulation of any electrostatic charge because the planar section 410, rails 411 and 412, legs 413 through 416 and hollow housing 420 are conductive.

This invention has been disclosed in terms of certain embodiments It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A carrier for electronic components housed in a transistor outline package with a predetermined array of terminals of a given size, said carrier comprising:
   A. a conductive frame having a planar transverse support at a predetermined location thereon and centered on a transverse axis through said conductive frame, and
   B. a resilient insulating insert extending along the transverse axis and integral with said planar transverse support for supporting the transistor outline package, said insert having a plurality of apertures therethrough in register with the terminal array, the size of certain said apertures corresponding to the size of the terminals whereby an interference fit exists between the terminals and the material adjacent the apertures, and said insert having a plurality of open segment means for partially surrounding individual terminals thereby to isolate electrically the terminals from each other and from said conductive frame, said carrier thereby simultaneously minimizing electrostatic charges while simultaneously insulating the terminals from each other.

2. A carrier system as recited in claim 1 wherein said conductive frame is composed of a high temperature rigid conductive material comprising a moldable material taken from the group consisting of polyether sulfones, polyether imides, polyaeryl sulfones and polyesters filled with a conductive filler.

3. A carrier system as recited in claim 2 wherein said conductive frame is composed of polyether sulfone having a filler taken from the group consisting of carbon and aluminum.

4. A carrier system as recited in claim 2 wherein the terminal array defines a square of a predetermined size, said insert comprising a hollow body portion aligned along the transverse axis and a top portion having a plurality of apertures therethrough corresponding to the array of the terminals for supporting the package, said body portion depending below said conductive frame means with a plurality of grooves extending parallel to the transverse axis formed in the sides thereof for defining said open segment means, said body portion having a length along the axis at least coextensive with the terminals, said conductive frame means additionally having a plurality of depending legs engaging corners of said body portion and a hollow housing portion spaced from said leg portions and coextensive with at least a portion of the length thereof for internally supporting said insert body portion.

5. A carrier system as recited in claim 4 wherein said insert is composed of a high-temperature moldable insulating material taken from the group consisting of polyether sulfones, polyether imides, polyaeryl sulfones and polyesters.

6. A carrier system as recited in claim 5 wherein said insert is composed of polyether sulfone.

7. A carrier system as recited in claim 2 wherein the terminal array of the transistor package is a circle, said insert comprising a cylindrical central core means coaxial with the transverse axis for supporting the package and said open segment means comprising a plurality of fins equal to the number of terminals radiating from said transverse axis and said central core thereby defining a plurality of open segments, cylindrical shell means surrounding said terminations of said fins over a portion of the axial length of said insert, and web means for interconnecting said fins, said central core means and said shell means, said web means having a plurality of apertures therethrough parallel to the transverse axis and intermediate adjacent ones of said fins.

8. A carrier system as recited in claim 7 wherein said insert is composed of a high temperature moldable insulating material taken from the group consisting of polyether sulfones, polyether imides, polyaeryl sulfones and polyesters.

9. A carrier system as recited in claim 8 wherein said insert is composed of polyether sulfone.

* * * * *